United States Patent
Sakurai et al.

(10) Patent No.: US 8,942,039 B2
(45) Date of Patent: Jan. 27, 2015

(54) NONVOLATILE SEMICONDUCTOR MEMORY DEVICE

(71) Applicant: Kabushiki Kaisha Toshiba, Minato-ku (JP)

(72) Inventors: Kiyofumi Sakurai, Yokohama (JP); Takuya Futatsuyama, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 55 days.

(21) Appl. No.: 13/839,090

(22) Filed: Mar. 15, 2013

(65) Prior Publication Data

US 2014/0063953 A1     Mar. 6, 2014

Related U.S. Application Data

(60) Provisional application No. 61/695,694, filed on Aug. 31, 2012.

(51) Int. Cl.
*G11C 11/34* (2006.01)
*G11C 16/06* (2006.01)
*G11C 16/04* (2006.01)

(52) U.S. Cl.
CPC ............ *G11C 16/06* (2013.01); *G11C 16/0483* (2013.01)
USPC ............ 365/185.11; 365/185.05; 365/185.06; 365/185.17; 365/185.23; 365/185.33

(58) Field of Classification Search
USPC ............. 365/185.11, 185.05, 185.06, 185.17, 365/185.23, 185.33
See application file for complete search history.

(56) References Cited

U.S. PATENT DOCUMENTS

| | | | |
|---|---|---|---|
| 7,133,314 B2 | 11/2006 | Futatsuyama et al. | |
| 7,151,686 B2 | 12/2006 | Sugimae et al. | |
| 7,313,009 B2 | 12/2007 | Futatsuyama | |
| 7,700,997 B2 | 4/2010 | Futatsuyama et al. | |
| 7,738,313 B2 | 6/2010 | Futatsuyama | |
| 7,952,930 B2 | 5/2011 | Sakurai et al. | |
| 2005/0104120 A1* | 5/2005 | Ichige et al. | 257/315 |
| 2007/0206398 A1 | 9/2007 | Nakamura et al. | |
| 2010/0265769 A1* | 10/2010 | Hwang et al. | 365/185.05 |

FOREIGN PATENT DOCUMENTS

| | | |
|---|---|---|
| JP | 2005-100538 | 4/2005 |
| JP | 2007-242700 | 9/2007 |
| JP | 2008-84457 | 4/2008 |
| JP | 2010-27097 A | 2/2010 |

* cited by examiner

*Primary Examiner* — Fernando Hidalgo
(74) *Attorney, Agent, or Firm* — Oblon, Spivak, McClelland, Maier & neustadt, L.L.P.

(57) ABSTRACT

This nonvolatile semiconductor memory device comprises: a memory cell array configured having a plurality of blocks arranged therein, each of the blocks configured as an arrangement of NAND cell units, each of the NAND cell units configured having a plurality of electrically rewritable memory cells and a select transistor connected in series; and a row decoder configured to select anyone of the blocks of the memory cell array and supply to any one of said blocks a voltage required in various kinds of operations. The row decoder comprises: a plurality of first transfer transistors each disposed in a first region and connected to any one of the memory cells; and a plurality of second transfer transistors each disposed in a second region and connected to the select transistor, the second region being a residual region of the first region.

16 Claims, 11 Drawing Sheets

NONVOLATILE SEMICONDUCTOR MEMORY DEVICE

CROSS REFERENCE TO RELATED APPLICATIONS

This application is based on and claims the benefit of priority from prior U.S. provisional Patent Application 61/695,694, filed on Aug. 31, 2012, the entire contents of which are incorporated herein by reference.

FIELD

Embodiments described in the present specification relate to a nonvolatile semiconductor memory device.

BACKGROUND

NAND type flash memory is widely known as an example of a nonvolatile semiconductor memory device. In NAND type flash memory, advances in miniaturization are leading also to an increase in the number of memory cells included in one NAND string. However, the increase in area of the row decoder accompanying these developments has become a problem.

DETAILED DESCRIPTION

A nonvolatile semiconductor memory device according to an embodiment described below comprises: a memory cell array configured having a plurality of blocks arranged therein, each of the blocks configured as an arrangement of NAND cell units, each of the NAND cell units configured having a plurality of electrically rewritable memory cells and a select transistor connected in series; and a row decoder configured to select any one of the blocks of the memory cell array and supply to any one of said blocks a voltage required in various kinds of operations. The row decoder comprises: a plurality of first transfer transistors each disposed in a first region and connected to any one of the memory cells; and a plurality of second transfer transistors each disposed in a second region and connected to the select transistor, the second region being a residual region of the first region.

The nonvolatile semiconductor memory device according to this embodiment is described below with reference to the drawings.

First Embodiment

Figure 1:
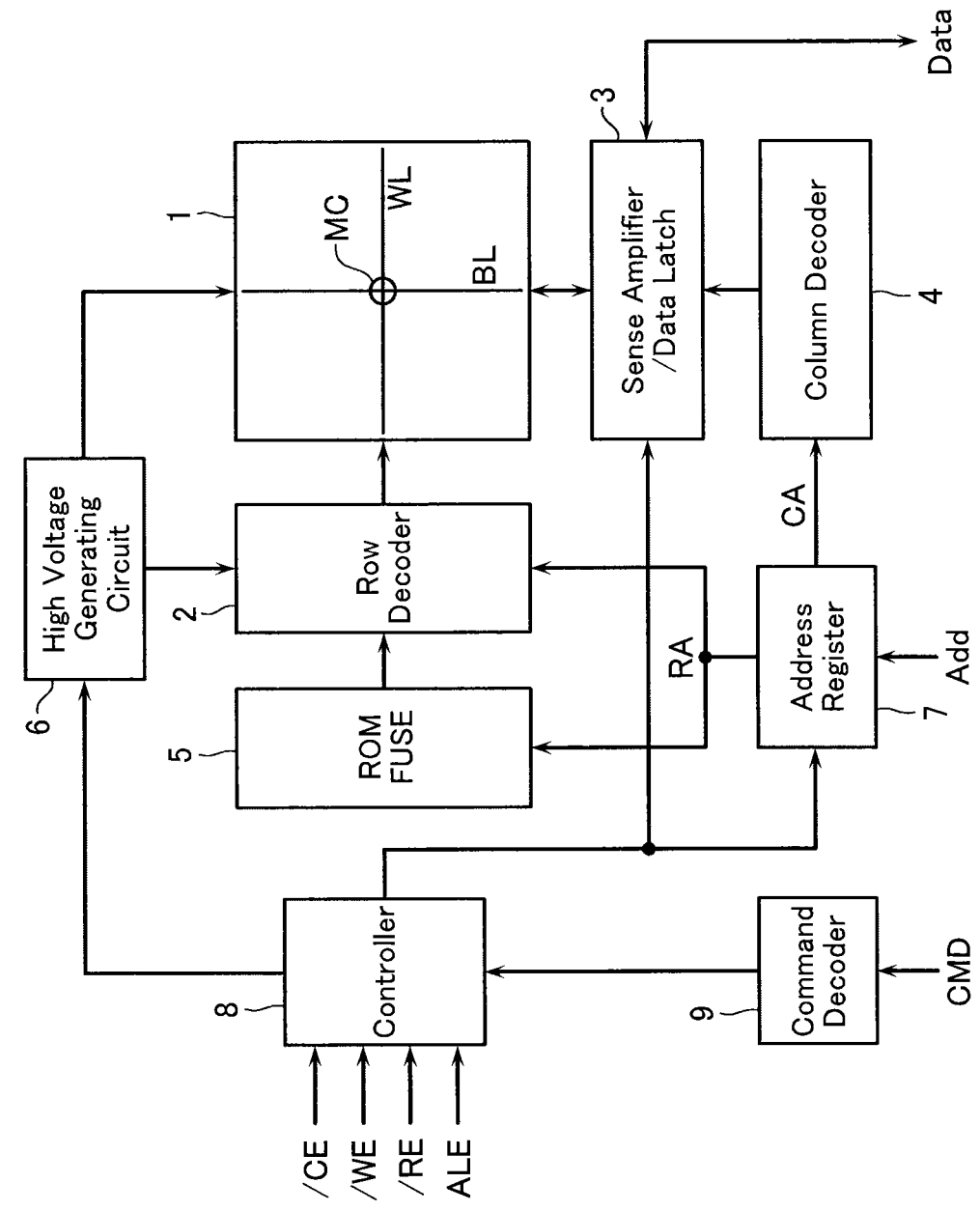
FIG. 1 shows a functional block configuration of a NAND type flash memory according to a first embodiment.

FIG. 1 shows a functional block configuration of a NAND type flash memory according to a first embodiment.

A memory cell array 1 is configured having electrically rewritable nonvolatile memory cells MC disposed at intersections of a plurality of word lines WL and a plurality of bit lines BL. As will be described later, a plurality of the memory cells MC, dummy memory cells, and a select gate transistor are connected in series to configure one NAND cell unit (the dummy memory cell may be omitted). Moreover, a plurality of NAND cell units commonly connected to an identical word line WL configure one block which is a minimum unit of an erase operation.

A row decoder 2 decodes a row address RA to select one block and the word lines WL in the memory cell array 1, and supplies to the memory cell array 1 a voltage required in various kinds of operations. A sense amplifier circuit 3 has a function for sensing bit line data and a data latch function. A column decoder 4 decodes a column address CA to perform bit line selection. An external address Add is downloaded into an address register 7, and the row address RA and the column address CA are supplied to the row decoder 2 and the column decoder 4, respectively.

A high voltage generating circuit 6 is provided for generating various kinds of high voltages employed in write and erase. A controller 8 is inputted with control signals such as a chip enable signal /CE, a write enable signal /WE, a read enable signal /RE, and an address latch enable signal ALE. The controller 8 is also supplied with a command CMD decoded by a command decoder 9. This enables the controller 8 to perform control of the high voltage generating circuit 6, sequence control of write or erase, and read operation control, according to an operation mode. A ROM fuse circuit 5 stores a defect address for defect remedy. Although detailed description is omitted, the ROM fuse circuit 5 is programmed to replace a block including a defective word line in the memory cell array 1 with a redundancy block.

Figure 2:
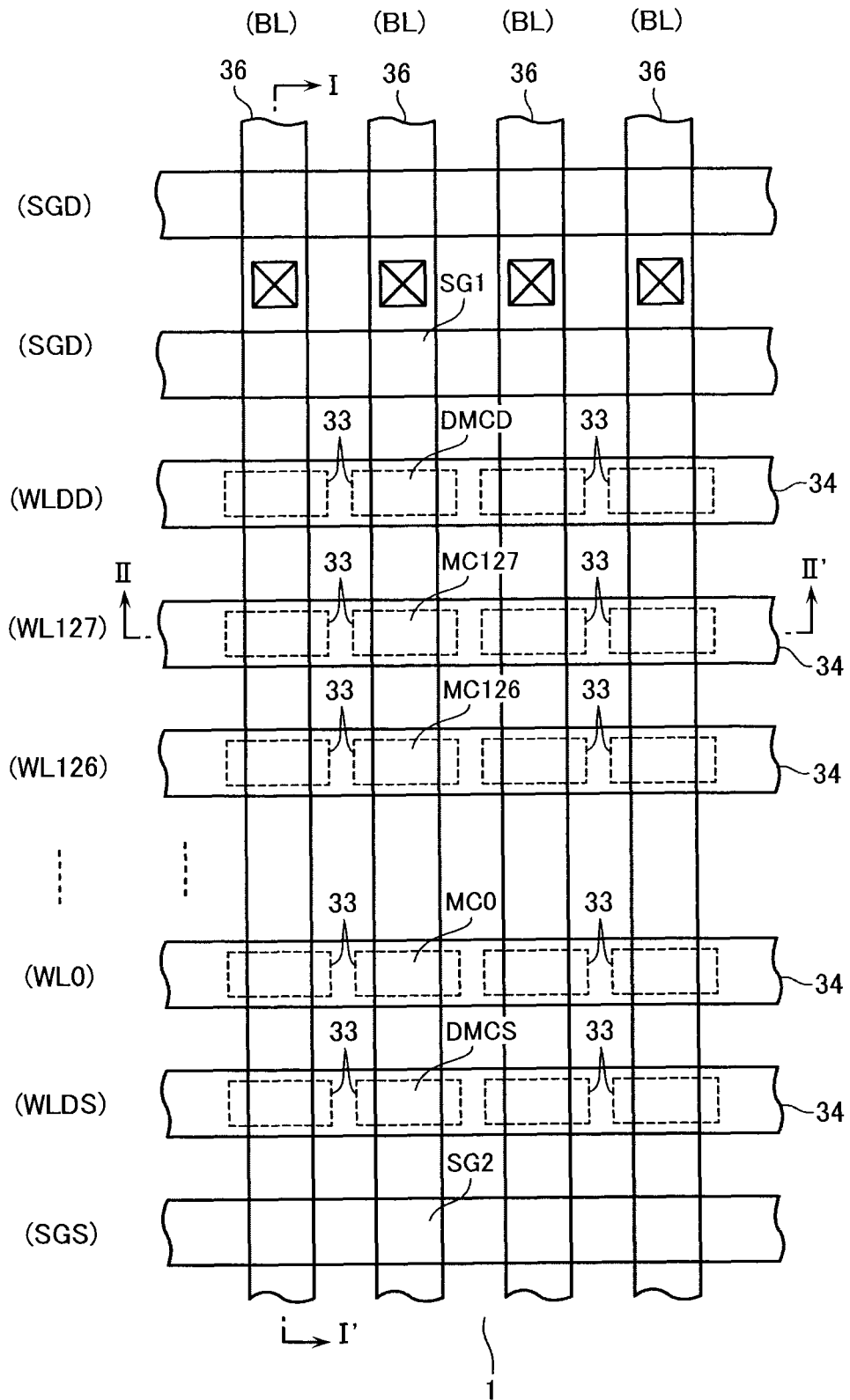
FIG. 2 shows a layout of a memory cell array 1.
Figure 3:
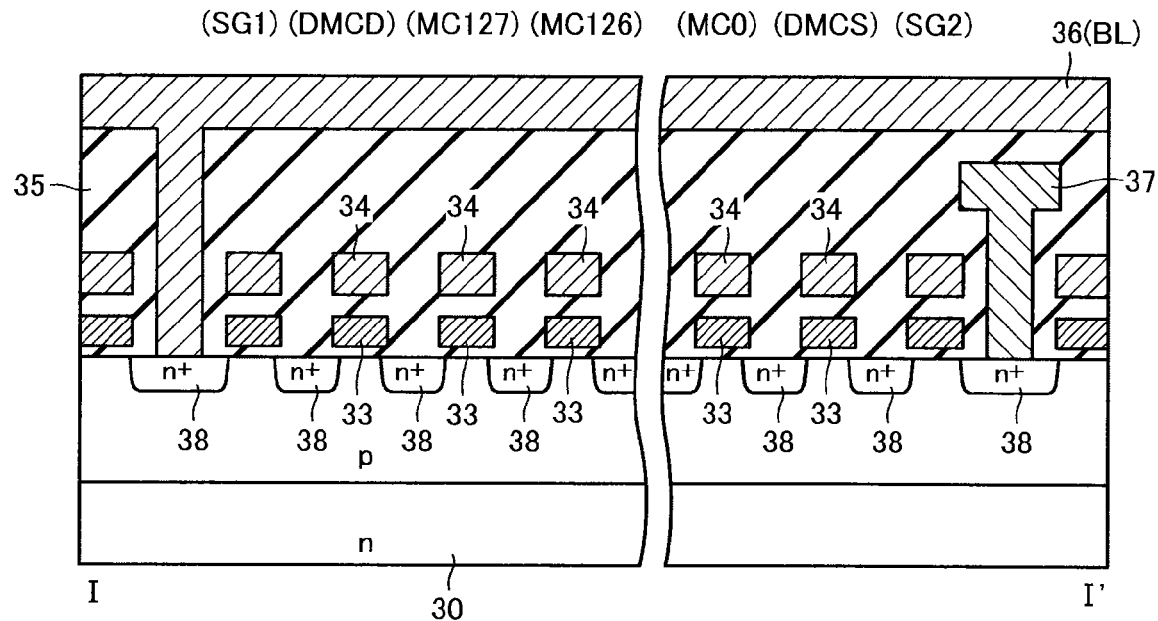
FIG. 3 shows a cross-sectional view taken along the line I-I' in FIG. 2.
Figure 4:
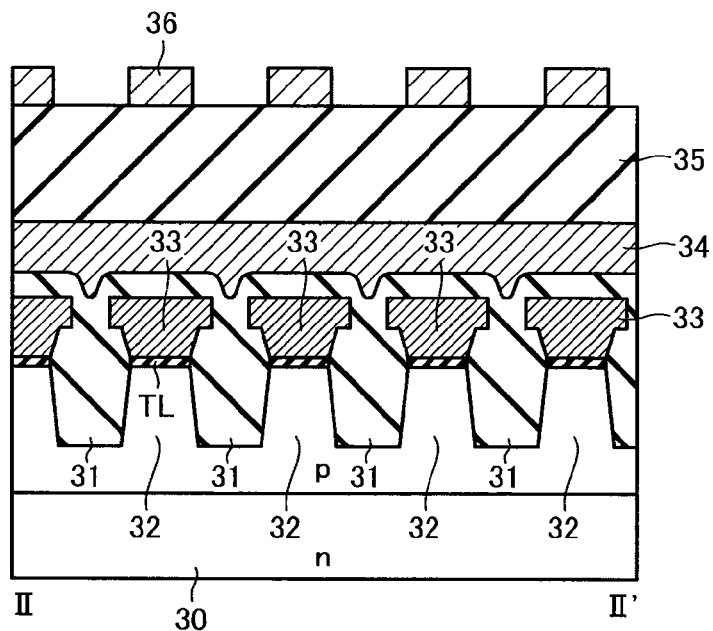
FIG. 4 shows a cross-sectional view taken along the line II-II' in FIG. 2.

FIG. 2 shows a layout of the memory cell array 1, and FIGS. 3 and 4 show, respectively, cross-sectional views taken along the lines I-I' and II-II' in FIG. 2. A p type well is formed in a memory cell array formation region of a silicon substrate 30. As shown in FIG. 4, element formation regions 32 having a striped shape of a certain pitch are partitioned in this p type well by an element isolation insulating film 31. A floating gate 33 configured by a polycrystalline silicon film is formed in each of the element formation regions 32 via a tunnel insulating film TL, and a control gate 34 configured by a polycrystalline silicon film is formed on this floating gate 33 via an inter-gate insulating film.

Moreover, as shown in FIG. 3, a source/drain diffusion region 38 is formed self-aligned with the control gate 34 to configure memory cells MC (MC0~MC127) and dummy memory cells DMCS and DMCD. The dummy memory cells DMCS and DMCD are connected to both ends of a memory string comprising the memory cells MC0~MC127 connected in series. The dummy memory cells DMCS and DMCD are further connected to source side select transistors SG2 and SG1, respectively.

The source/drain diffusion region 38 of the memory cells MC and the dummy memory cells DMCS and DMCD is shared by adjacent memory cells MC and dummy memory cells DMCS and DMCD. Having such a plurality of the memory cells MC, dummy memory cells DMCS and DMCD, and select gate transistors SG1 and SG2 connected in series sharing the source/drain diffusion region 38 results in a NAND cell unit NU being configured. The select gate transistors SG1 and SG2 are connected to both ends of the NAND cell unit NU (specifically, to the dummy memory cells DMCS or DMCD and a source line).

As shown in FIGS. 2 and 4, the control gate 34 is patterned continuously in one direction to become the word lines (WL) and dummy word lines (WLDS and WLDD). The memory cell array 1 is covered over by an interlayer insulating film 35 and the bit lines (BL) 36 are arranged on this interlayer insulating film 35. The bit line 36 contacts the diffusion region 38 of the drain side select gate transistor SG1 in the NAND cell unit. A common source line (SL) 37 contacting the diffusion region 38 of the source side select gate transistor SG2 in the NAND cell unit is buried within the interlayer insulating film 35.

Figure 5:
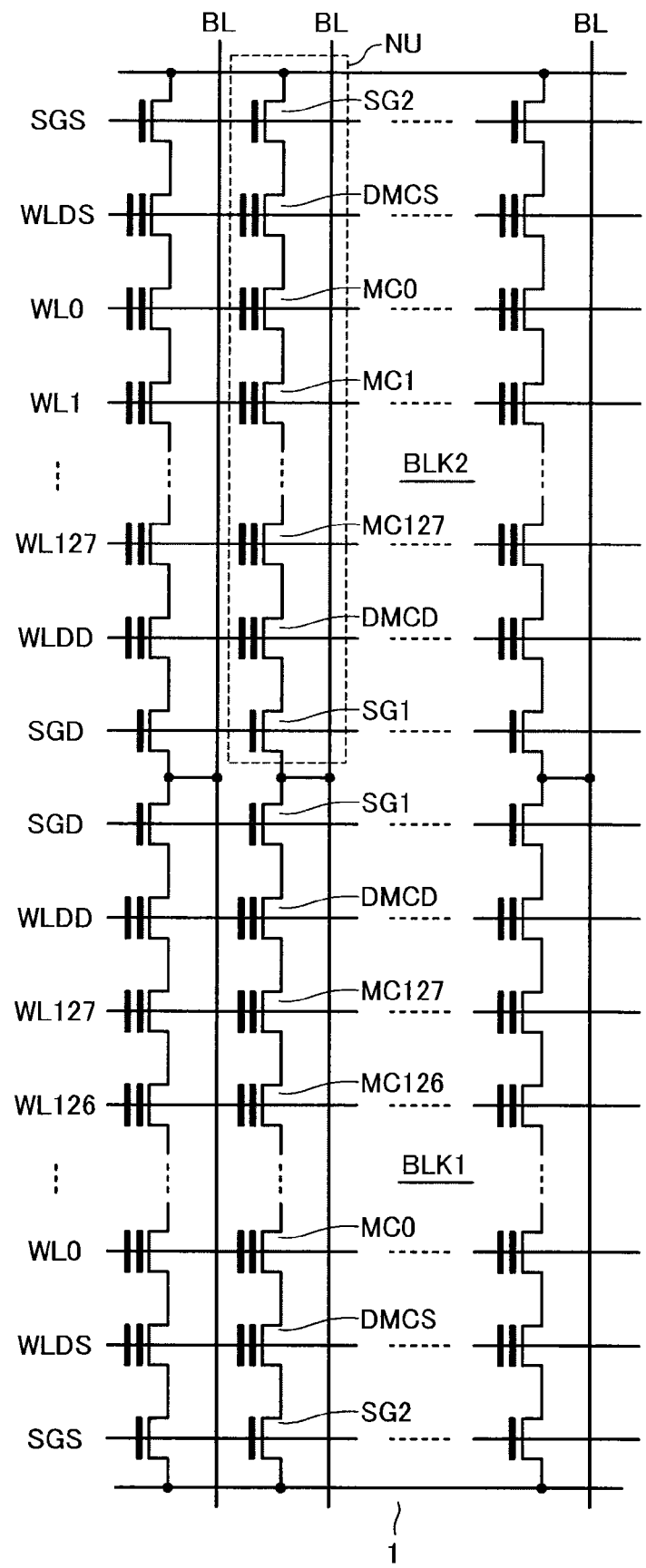
FIG. 5 is an equivalent circuit diagram of the memory cell array 1 in FIG. 1.

FIG. 5 is an equivalent circuit diagram of the memory cell array 1 in FIG. 1. As mentioned previously, in the memory cell array 1, a plurality of blocks BLKi each of which is a unit of data rewrite are aligned in a bit line direction. In FIG. 5, two blocks BLK0~BLK1 are shown as an example.

Figure 6:
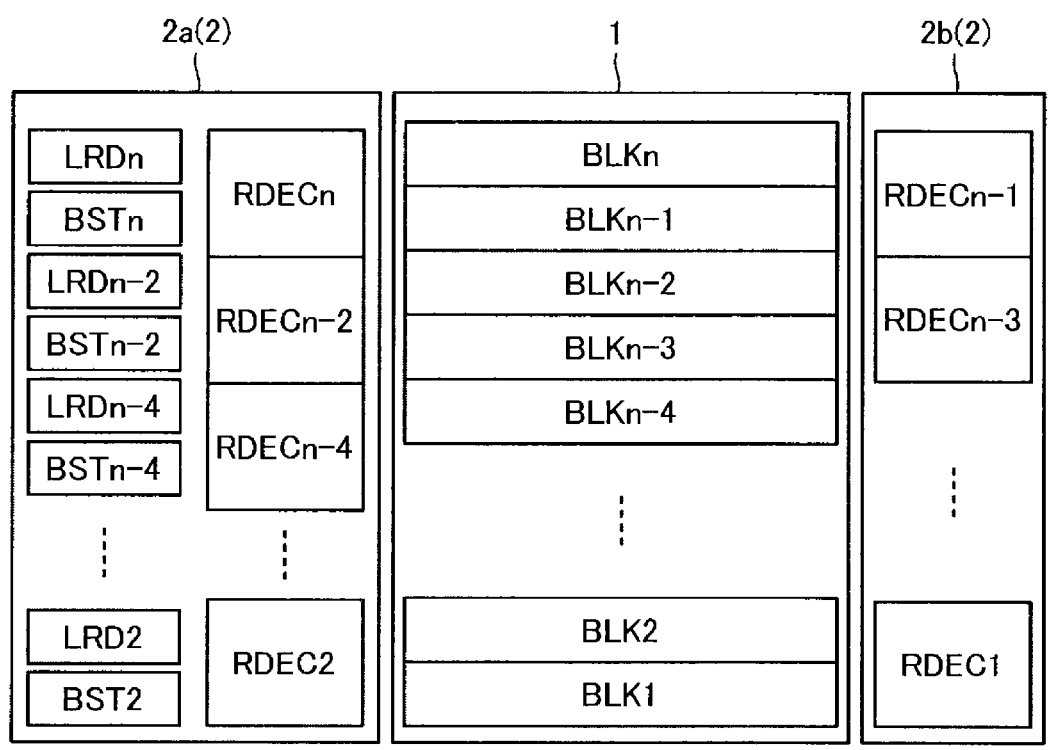
FIG. 6 shows a more detailed block diagram of the memory cell array 1 and a row decoder 2.

FIG. 6 shows a more detailed block diagram of the memory cell array 1 and the row decoder 2. As mentioned previously, the memory cell array 1 comprises a plurality of blocks BLK (BLK1~BLKn) aligned in the bit direction.

Moreover, the row decoder 2 comprises two sub row decoders 2a and 2b disposed partitioned to left and right of this memory cell array 1. The sub row decoder 2a comprises n/2 gate circuits RDEC2, . . . , RDECn-2, and RDECn. Similarly, the sub row decoder 2b comprises n/2 gate circuits RDEC1, RDECn-3, and RDECn-1.

The gate circuits RDEC2, . . . , RDECn-2, and RDECn are each provided corresponding to a respective adjacent two of the blocks BLK. Therefore, a width in the bit line direction of one of the gate circuits RDEC is configured to be approximately twice a width in the bit line direction of one of the blocks BLK. The same applies to the gate circuits RDEC1, RDECn-3, and RDECn-1.

Moreover, the sub row decoder 2a comprises n/2 local row decoder circuits LRD2, LRDn-2, and LRDn, and n/2 boost circuits BST2, BSTn-2, and BSTn.

The local row decoders LRD and the boost circuits BST in the sub row decoder 2a supply a signal and a voltage also to the gate circuits RDEC in the sub row decoder 2b. That is, the local row decoders LRD and the boost circuits BST are shared by the left and right sub row decoders 2a and 2b. For example, the local row decoder LRDn supplies a signal to the block BLKn via the gate circuit RDECn and supplies the signal also to the block BLKn-1 via the gate circuit RDECn. In addition, the boost circuit BSTn supplies a boost voltage XFERn to the gate circuit RDECn and supplies the boost voltage XFERn also to the gate circuit RDECn-1.

Figure 7:
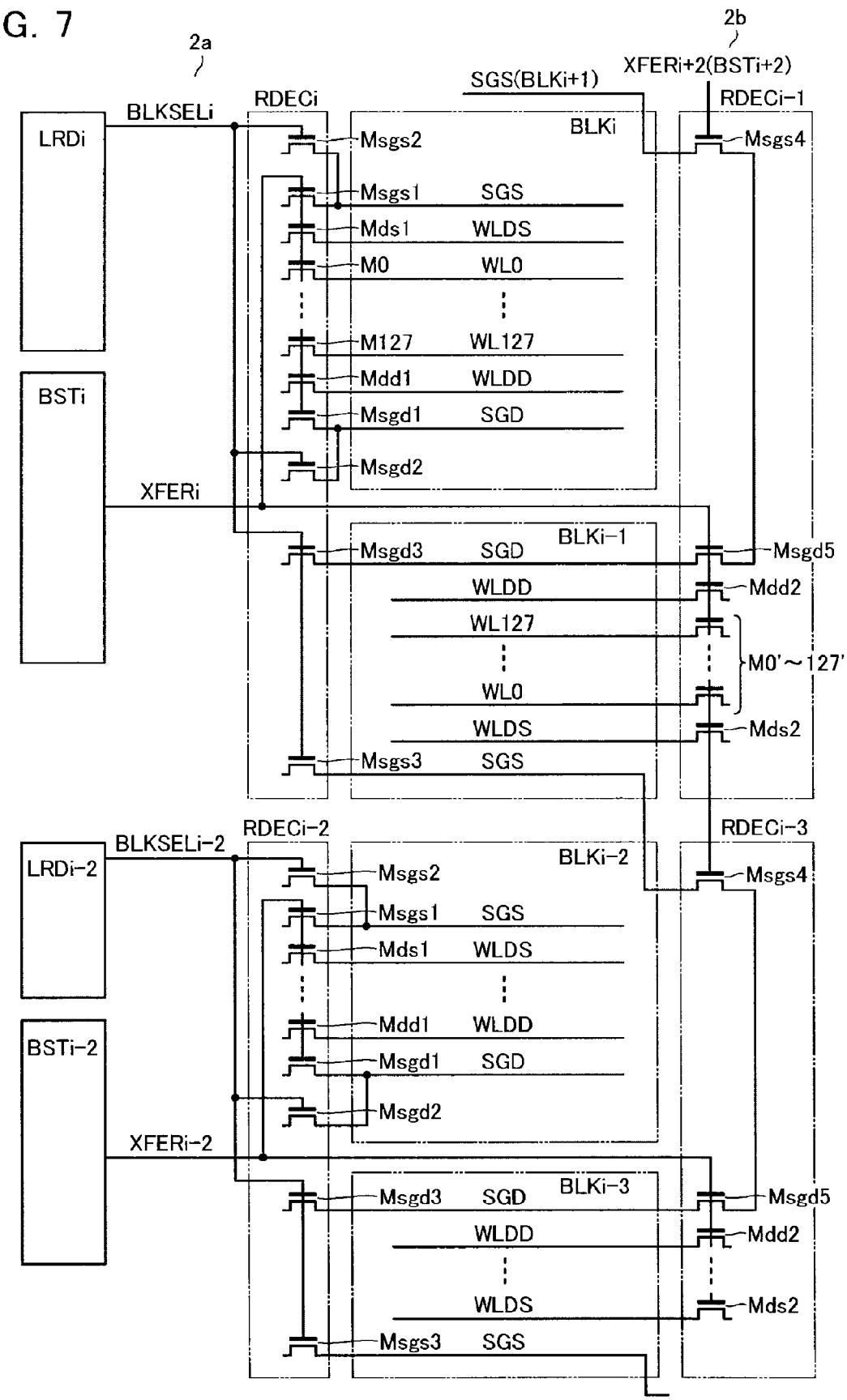
FIG. 7 is an equivalent circuit showing a specific configuration of a gate circuit RDEC.

FIG. 7 is an equivalent circuit showing a specific configuration of the gate circuit RDEC. In FIG. 7, four blocks BLKi-3~BLKi of the n blocks BLK1~BLKn are shown representatively.

The gate circuits RDECi-2 and RDECi in the sub row decoder 2a each comprise transfer transistors M0~M127 and Mds1 and Mdd1 connected to the word lines WL0~WL127 and dummy word lines WLDS and WLDD. Moreover, the gate circuits RDECi-2 and RDECi comprise transfer transistors Msgs1 and Msgd1 connected to select gate lines SGS and SGD. These transfer transistors M0~M127, Mds1 and Mdd1, and Msgs1 and Msgd1 are controlled by the boost voltage XFERi supplied from the boost circuit BST.

In addition, the gate circuits RDECi-2 and RDECi comprise transfer transistors Msgs2 and Msgd2 connected to the select gate lines SGS and SGD. These transfer transistors Msgs2 and Msgd2 are controlled by a block selection signal BLKSELi supplied from the local row decoder LRDi.

Moreover, the gate circuit RDECi comprises not only the transfer transistors Msgs2 and Msgd2 connected to the select gate lines SGS and SGD in the block BLKi, but also transfer transistors Msgs3 and Msgd3 connected to the select gate lines SGS and SGD in the block BLKi-1 adjacent to the block BLKi. These transfer transistors Msgs3 and Msgd3 are controlled by the block selection signal BLKSELi supplied from the local row decoder LRDi. The gate circuit RDECi-2 also has a similar configuration.

Meanwhile, the gate circuits RDECi-3 and RDECi-1 in the sub row decoder 2b each comprise transfer transistors M0'~M127' and Mds2 and Mdd2 connected to the word lines WL0~WL127 and dummy word lines WLDS and WLDD. Moreover, the gate circuits RDECi-3 and RDECi-1 comprise a transfer transistor Msgd5 connected to the select gate line SGD. These transfer transistors M0'~M127', Mds2 and Mdd2, and Msgd5 are controlled by boost voltages XFERi-2 and XFERi supplied from the boost circuits BSTi-2 and BSTi.

In addition, the gate circuits RDECi-3 and RDECi-1 each comprise a transfer transistor Msgs4 connected to the source side select gate line SGS of the blocks BLKi-1 and BLKi+1 (not shown in FIG. 7), respectively. This transfer transistor Msgs4 is controlled by boost voltages XFERi and XFERi+2 supplied from the boost circuits BSTi and BSTi+2 (not shown in FIG. 7). In this way, each of the gate circuits RDECi-3 and RDECi-1 in the sub row decoder 2b of the present embodiment comprises the transfer transistor Msgs4 connected not only to a line in the corresponding block BLKi-3 or BLKi-1, but also to a line (source side select gate line SGS) in the block BLKi-1 or BLKi+1 separated by two from these blocks BLKi-3 and BLKi-1. The reason is to reduce area of the row decoder 2.

Figure 8:
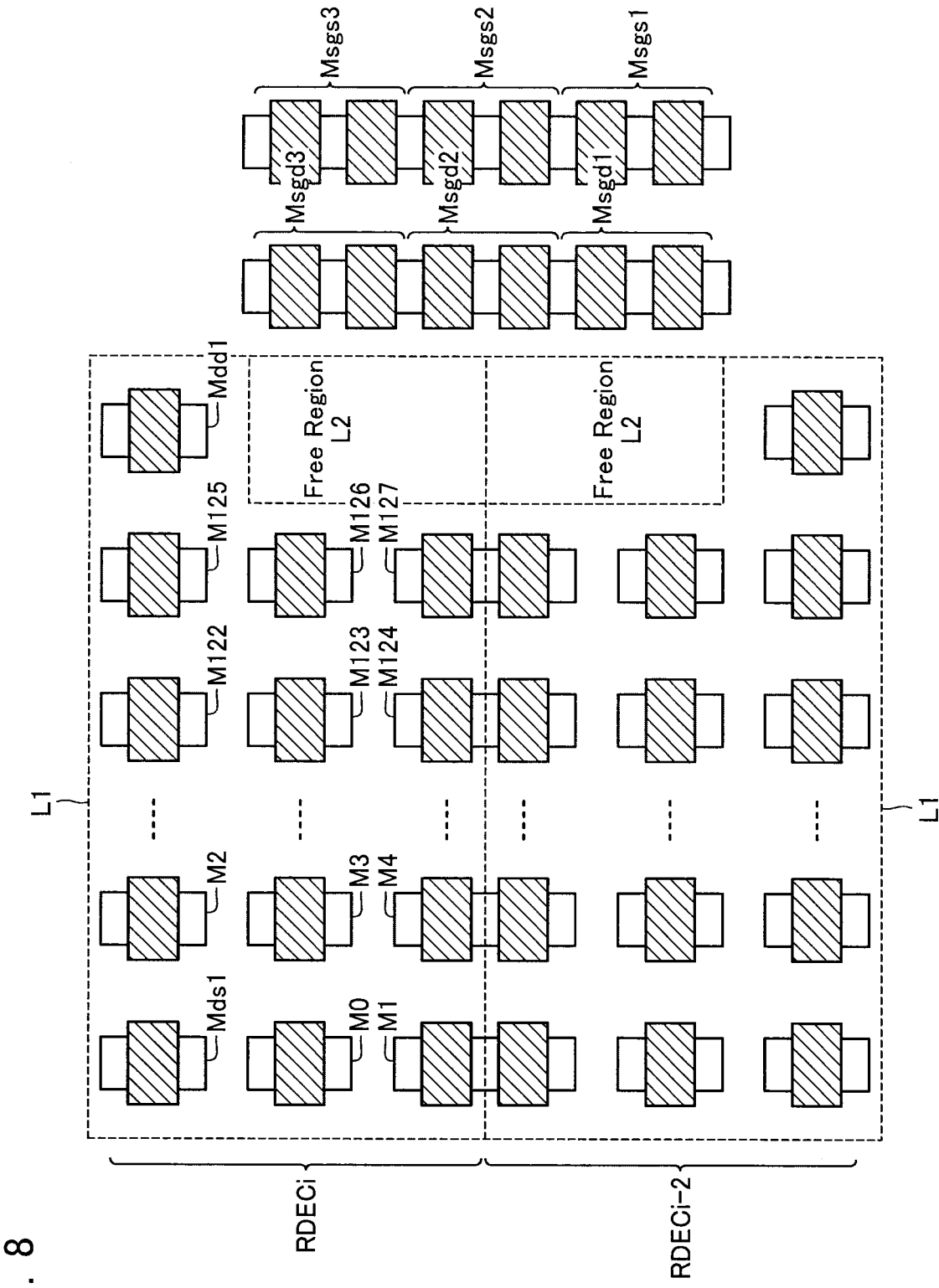
FIG. 8 shows a layout example of agate circuit RDEC according to a comparative example.

The reason for adopting the configuration of FIG. 7 is described with reference to FIGS. 8~11. FIG. 8 shows a layout example of gate circuits RDEC according to a comparative example, and FIGS. 9 and 10 show a layout example of the gate circuits RDEC according to the present embodiment.

First, a configuration of the gate circuits RDEC according to the comparative example is described with reference to FIG. 8. FIG. 8 shows a layout example of gate circuits RDECi and RDECi-2 in the sub row decoder 2a.

The transfer transistors M0~M127 and Mds1 and Mdd1 included in the gate circuits RDECi or RDECi-2 are high-voltage transistors applied with a high voltage. Hence, a size of these transfer transistors is inevitably large compared to a size of the memory cells. It is therefore impossible for the 130 of these transfer transistors to be arranged in a line along a direction that the 130 word lines WL and dummy word lines DWL are arranged, in the gate circuit RDEC (the transfer transistors cannot be housed in the block BLKi). Hence, as shown in FIG. 8, these transfer transistors must be arranged in a matrix (for example, 3 rows and 44 columns) in a rectangular-shaped region L1, for example. In this case, although it depends on the number of rows and number of columns in the matrix, a free region L2 sometimes occurs in the region L1. Specifically, when the number of rows or the number of columns is set to an odd number, such a free region L2 necessarily occurs. Such a free region L2 is a cause of occupied area of the row decoder 2 being increased.

Figure 9:
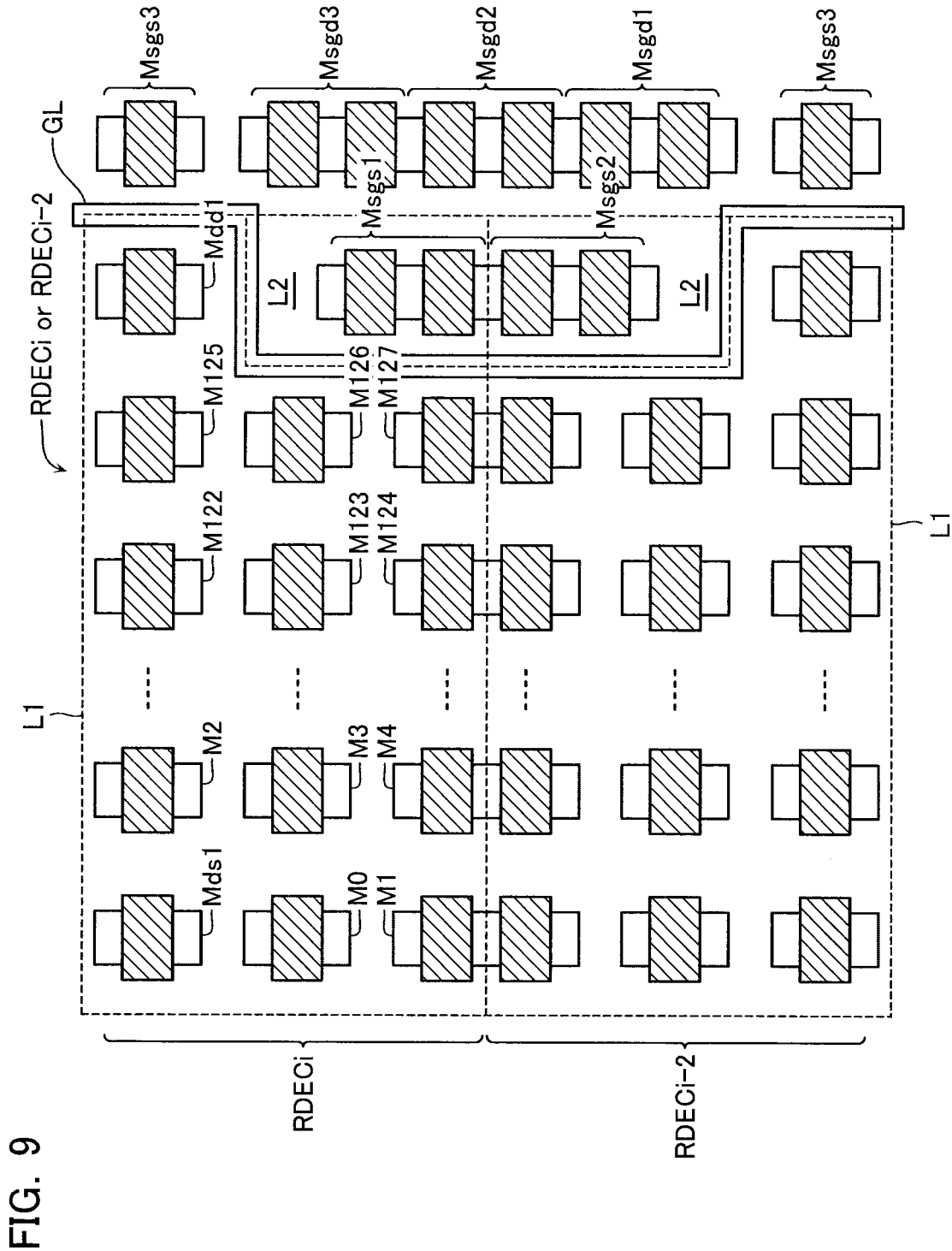
FIGS. 9~12 show layout examples of gate circuits RDEC according to the present embodiment.
Figure 10:
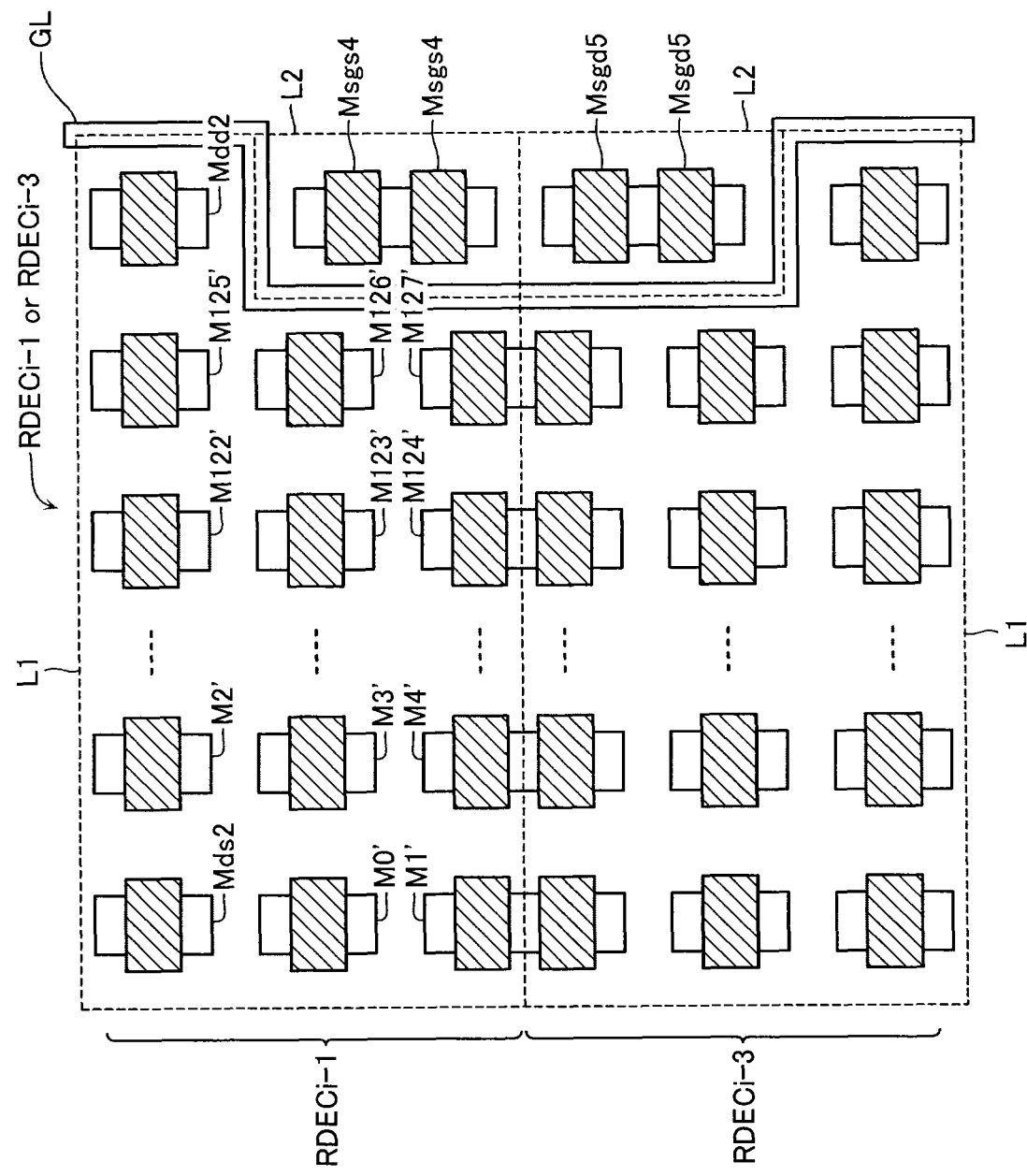

Next, the layout example of the gate circuits RDEC in the present embodiment is shown in FIGS. 9 and 10. FIG. 9 shows a configuration of the gate circuits RDECi or RDECi-2 in the sub row decoder 2a, and FIG. 10 shows a configuration of the gate circuits RDECi-1 or RDECi-3 in the sub row decoder 2b.

As shown in FIGS. 9 and 10, in the present embodiment, the transfer transistors M0~M127 and Mds1 and Mdd1 (130) included in one of the gate circuits RDEC are disposed in a matrix in the region L1. Moreover, disposed in a region L2 which is a residual region of the region L1 are the transfer transistors Msgs and Msgd. Adjacent two of the gate circuits RDECi and RDECi-2 include the regions L2 such that corresponding regions L2 in the two gate circuits RDECi and RDECi-2 are adjacent and continuous. Note that, although not shown in the drawings, the transistors disposed in a matrix are connected to the memory cells and dummy memory cells by contacts connected to a source/drain diffusion region and metal wiring connected to upper ends of those contacts. A similar configuration is disclosed in, for example, JP 2007-242700 A included as reference in the present specification. Moreover, as shown in FIGS. 9 and 10, a well-known guard ring GL (well contact) may be formed between the regions L1 and L2.

It is preferable for transistors of the same kind to be disposed adjacently in the region L2. Specifically, it is preferable for transistors applied simultaneously with an identical or similar voltage to be disposed sharing a source/drain diffusion region.

Note that, as shown in FIG. 8, it is preferable for other transfer transistors Msgs and Msgd that cannot be disposed in the region L2 to also be formed having transistors of the same kind sharing a source/drain diffusion region. This enables an exclusive area of the transfer transistors Msgs and Msgd to be reduced. As explained in FIG. 7, in the present embodiment, transfer transistors connected to wiring (source side select gate line SGS) of a block separated by two from their corresponding block are disposed in the gate circuits RDEC. This allows transistors of the same kind to be disposed in a form sharing a source/drain diffusion region, whereby a reduction in occupied area of the row decoder can be achieved.

Figure 11:
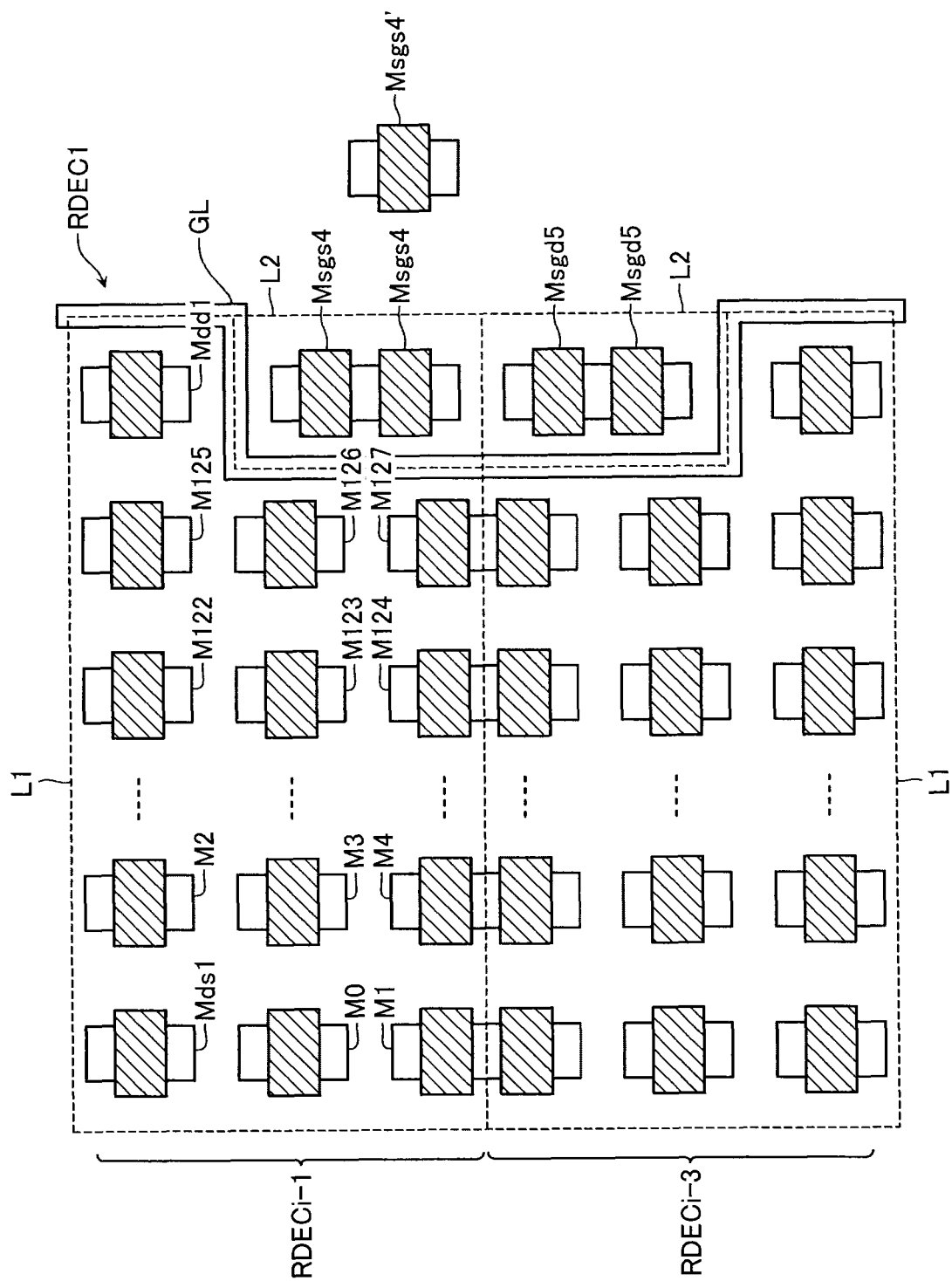
Figure 12:
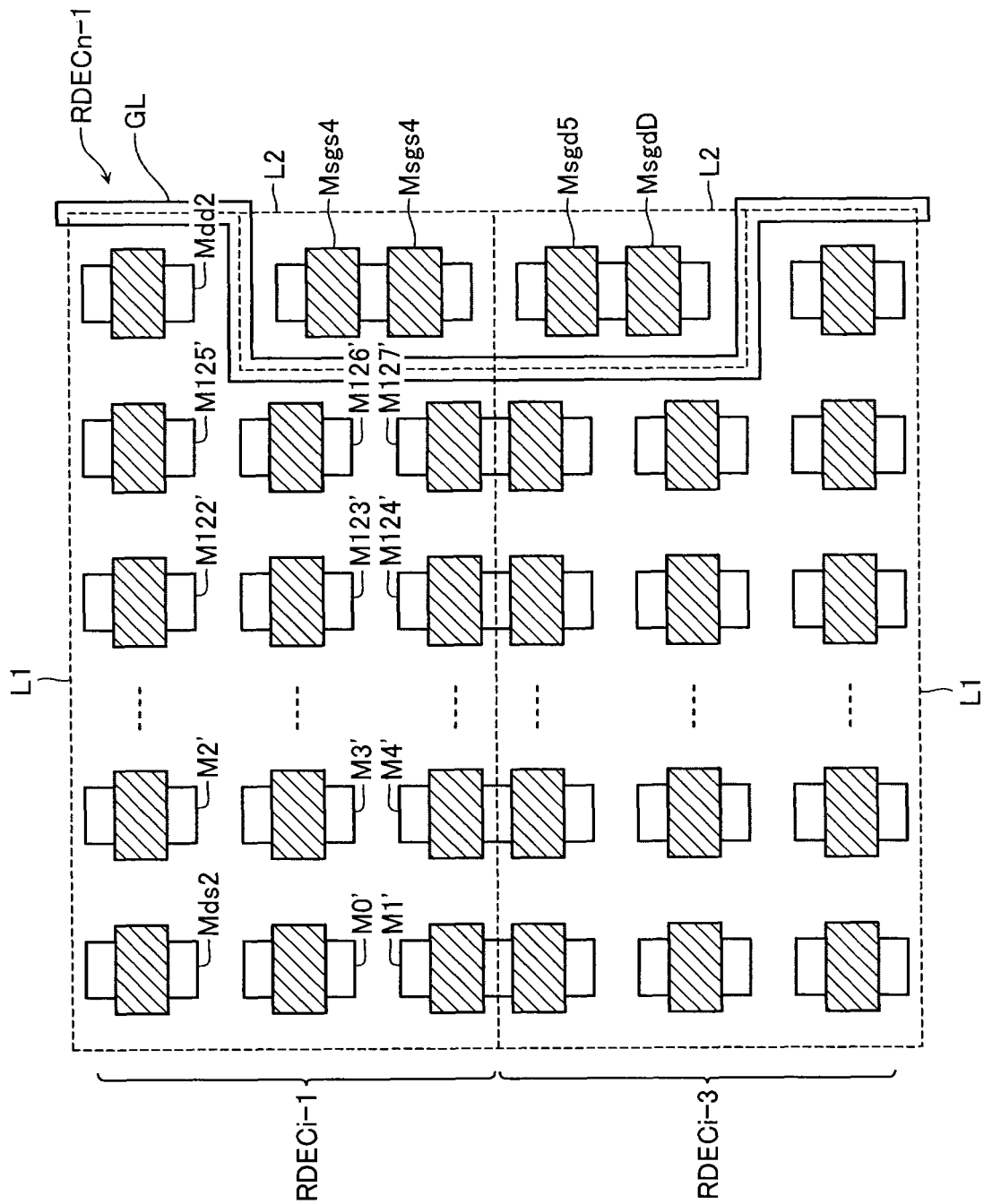

Note that, as shown in FIG. 11, the gate circuit RDEC1 at a first end in the sub row decoder 2b includes a transfer transistor Msgs4' not included in the region L2. Conversely, as shown in FIG. 12, the gate circuit RDECn-1 at a second end in the sub row decoder 2b includes a surplus region L3 in the region L2, hence comprises a dummy transistor MsgdD in that surplus region L3.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the above-described embodiments adopt a system where the boost circuits and local row decoders are shared by left and right sub row decoders. However, the present invention is not limited to this system. For example, the present invention may also be applied to a semiconductor memory device where the row decoder is present on only one side of the memory cell array.

What is claimed is:

1. A nonvolatile semiconductor memory device, comprising:
a memory cell array configured having a plurality of blocks arranged therein, each of the blocks configured as an arrangement of NAND cell units, each of the NAND cell units configured having a plurality of electrically rewritable memory cells and a select transistor connected in series; and
a row decoder configured to select any one of the blocks of the memory cell array and supply to any one of said blocks a voltage required in various kinds of operations,
the row decoder comprising: a first sub row decoder disposed on a first side of the memory cell array; and a second sub row decoder disposed on a second side which is an opposite side to the first side of the memory cell array,
the first sub row decoder comprising:
a plurality of first transfer transistors each disposed in a rectangular first region and connected to any one of the memory cells; and
a plurality of second transfer transistors disposed in a second region and connected to respective ones of the select transistors, the second region being a residual region of the first region, and the second sub row decoder comprising: a plurality of fifth transfer transistors each disposed in a rectangular third region and connected to any one of the memory cells; and a plurality of sixth transfer transistors disposed in a fourth region and connected to respective ones of the select transistors, the fourth region being a residual region of the third region.

2. The nonvolatile semiconductor memory device according to claim 1, wherein
at least one of the plurality of second transfer transistors disposed in the second region and the plurality of sixth transfer transistors disposed in the fourth region share a drain/source diffusion region.

3. The nonvolatile semiconductor memory device according to claim 2, wherein
at least one of the plurality of first transfer transistors and the plurality of fifth transfer transistors are disposed in a matrix in the first region or in the third region.

4. The nonvolatile semiconductor memory device according to claim 1, wherein
a third transfer transistor and a fourth transfer transistor acting as the second transfer transistors are connected to a select gate line of the select transistors, the third transfer transistor connected to a drain side select transistor connected to a bit line, and the fourth transfer transistor connected to a source side select transistor connected to a source line, and
in the second region, a plurality of the third transfer transistors or a plurality of the fourth transfer transistors share a drain/source diffusion region.

5. The nonvolatile semiconductor memory device according to claim 1, further comprising:
a guard ring formed between the first region and the second region or between the third region and the fourth region.

6. A nonvolatile semiconductor memory device, comprising:
a memory cell array configured having a plurality of blocks arranged therein, each of the blocks configured as an arrangement of NAND cell units, each of the NAND cell units configured having a plurality of electrically rewriteable memory cells and a select transistor connected in series; and
a row decoder configured to select any one of the blocks of the memory cell array and supply to any one of said blocks a voltage required in various kinds of operations, the row decoder comprising: a first sub row decoder disposed on a first side of the memory cell array; and a second sub row decoder disposed on a second side which is an opposite side to the first side of the memory cell array, the first sub row decoder comprising: a first gate circuit including a plurality of first transfer transistors disposed in a first region and connected to first ones of the memory cells, and plurality of second transfer transistors disposed in a second region and connected to respective ones of the select transistors, the second region being a residual region of the first region; and a boost circuit for generating a control signal supplied to a gate of the first transfer transistors and the second transfer transistors, and the second sub row decoder comprising a second gate circuit that includes fifth transfer transistors disposed in a third the first region and connected to second ones of the memory cells, and sixth transfer transistors disposed in a fourth region and connected to respective ones of the select transistors, the fourth region being a residual region of the third region, and the fifth transfer transistors and the sixth transfer transistors being supplied with the control signal from the boost circuit in the first row decoder.

7. The nonvolatile semiconductor memory device according to claim 6, wherein a third transfer transistor and a fourth transfer transistor acting as the second transfer transistor are connected to a select gate line of the select transistor, and a gate of the third transfer transistor is supplied with the control signal, and the fourth transfer transistor is supplied with a block select signal whose logic switches according to selection/non-selection of the block.

8. The nonvolatile semiconductor memory device according to claim 7, wherein the first sub row decoder further comprises a local row decoder configured to supply the block select signal to the fourth transfer transistor in the first sub row decoder and the fourth transfer transistor in the second sub row decoder.

9. The nonvolatile semiconductor memory device according to claim 6, wherein at least one of the plurality of second transfer transistors disposed in the second region and the plurality of sixth transfer transistors disposed in the fourth region share a drain/source diffusion region.

10. The nonvolatile semiconductor memory device according to claim 6, wherein at least one of the plurality of first transfer transistors and the plurality of third transfer transistors are disposed in a matrix in the first region.

11. The nonvolatile semiconductor memory device according to claim 6, wherein the first gate circuit includes the second region, the second gate circuit includes the fourth region, and at least one of the second regions and the fourth regions of adjacent two of the first gate circuits or second gate circuits are disposed adjacently to each other to be continuous.

12. The nonvolatile semiconductor memory device according to claim 11, wherein at least one of the plurality of second transfer transistors disposed in the second region and the plurality of sixth transfer transistors disposed in the fourth region share a drain/source diffusion region.

13. The nonvolatile semiconductor memory device according to claim 11, wherein at least one of the plurality of first transfer transistors and the plurality of fifth transfer transistors are disposed in a matrix in the first region or in the third region.

14. The nonvolatile semiconductor memory device according to claim 6, wherein in one of the second gate circuits, the fifth transfer transistor is connected to a first block, and at least a portion of the sixth transfer transistors are connected to a second block which is distinct from the first block.

15. The nonvolatile semiconductor memory device according to claim 14, wherein the second gate circuit positioned at a first end in the second sub row decoder comprises a dummy transistor.

16. The nonvolatile semiconductor memory device according to claim 6, further comprising:

a guard ring formed between the first region and the second region or between the third region and the fourth region.

* * * * *